(12) United States Patent
Imanishi et al.

(10) Patent No.: US 6,481,616 B2
(45) Date of Patent: Nov. 19, 2002

(54) BUMP BONDING DEVICE AND BUMP BONDING METHOD

(75) Inventors: Makoto Imanishi, Neyagawa (JP); Akihiro Yamamoto, Kobe (JP); Hiroyuki Otani, Ikoma (JP); Shinzo Eguchi, Kyotanabe (JP); Takahiro Yonezawa, Neyagawa (JP); Kazushi Higashi, Kadoma (JP); Koichi Yoshida, Higashiosaka (JP); Kouji Hirotani, Osaka (JP)

(73) Assignee: Matsushita Electric Industrial Co. Ltd., Osaka (JP)

( * ) Notice: Subject to any disclaimer, the term of this patent is extended or adjusted under 35 U.S.C. 154(b) by 0 days.

(21) Appl. No.: 09/978,872

(22) Filed: Oct. 17, 2001

(65) Prior Publication Data

US 2002/0030087 A1 Mar. 14, 2002

Related U.S. Application Data

(62) Division of application No. 09/202,567, filed as application No. PCT/JP97/02075 on Jun. 17, 1997, now Pat. No. 6,328,196.

(30) Foreign Application Priority Data

Jun. 17, 1996 (JP) ............................................. 8-155748

(51) Int. Cl.[7] .............................................. B23K 31/02
(52) U.S. Cl. .................................................. 228/179.1
(58) Field of Search ........................... 228/179.1, 8, 9, 228/12, 49.5, 101, 102, 106, 180.22, 6.2, 180.21; 438/15, 613; 257/737, 738

(56) References Cited

U.S. PATENT DOCUMENTS

| 3,696,985 A | 10/1972 | Herring et al. |
| 3,775,579 A | 11/1973 | Burghart et al. |
| 4,398,350 A | 8/1983 | Inoue |
| 4,551,675 A | * 11/1985 | Heys et al. |
| 4,865,491 A | * 9/1989 | Sakurai |
| 4,892,993 A | 1/1990 | Stol |
| 5,205,460 A | * 4/1993 | Sato et al. |
| 5,264,676 A | 11/1993 | Kanaya et al. |
| 5,288,008 A | 2/1994 | Haji et al. |
| 5,377,897 A | 1/1995 | Zimmer |
| 5,788,143 A | 8/1998 | Boyd et al. |
| 5,958,262 A | 9/1999 | Palko et al. |

FOREIGN PATENT DOCUMENTS

| JP | 63-86551 | 4/1988 |
| JP | 7-237708 | 9/1995 |
| JP | 8-78418 | 3/1996 |

OTHER PUBLICATIONS

Japanese language search report for Int'l Appln No. PCT/JP97/02075 dated Sep. 2, 1997.

English language translation of Japanese language search report. for PCT JP97/02075 dated Sep. 2, 1997.

* cited by examiner

Primary Examiner—Tom Dunn
Assistant Examiner—Jonathan Johnson
(74) Attorney, Agent, or Firm—RatnerPrestia

(57) ABSTRACT

To eliminate breakage of electronic parts or defective bonding, and enhance reliability of electronic parts, in regulation of electronic parts in bump bonding device. A bump bonding device comprising a stage 1 for mounting and heating an electronic part, and a position regulating device including a rotatable regulating plate 2 having a side for positioning the electronic part, a plate 4 having a side for positioning the electronic part in collaboration with the regulating plate, and a regulating spring 5 for applying a regulating force to the regulating plate in order to press the electronic part to the plate 4.

7 Claims, 9 Drawing Sheets

```
┌─────────────────────────────┐
│     Mounting on stage       │
└─────────────────────────────┘
              ↓
┌─────────────────────────────┐
│     Turning on suction      │
└─────────────────────────────┘
              ↓
┌─────────────────────────────┐
│         Regulating          │
└─────────────────────────────┘
              ↓
┌─────────────────────────────┐
│          Bonding            │
└─────────────────────────────┘
```

FIG. 10
PRIOR ART

BUMP BONDING DEVICE AND BUMP BONDING METHOD

CROSS-REFERENCE TO RELATED APPLICATIONS

This application is a divisional of U.S. patent application Ser. No. 09/202,567 filed Dec. 17, 1998 now U.S. Pat. No. 6,328,196 which is a 371 of PCT/JP97/02075 filed Jun. 17, 1997.

TECHNICAL FIELD

The present invention relates to a bump bonding device for forming bump electrodes on electrodes of semiconductor electronic parts, and its method.

BACKGROUND ART

Referring to FIG. 6 to FIG. 11, conventional bump bonding device and bump bonding method are described below.

FIG. 6 is a perspective view of a bump bonding device for forming a bump on an electronic part 3 by using a gold wire 13.

In the diagram, the electronic part 3 supplied from a tray 10 is fixed on a heated stage 1 by means of a suction collet 11. A capillary 12 is held by an ultrasonic feed unit, and is provided with an ultrasonic wave, and a gold bump is formed on the electrode of the electronic part 3 by the capillary 12 in which the gold wire 13 is passed. After forming bumps on specified positions thereof, the electronic part 3 is stored in a tray 10a by means of the suction collet 11.

FIG. 7 is a process diagram showing the bump forming process.

First, at step (a), the gold wire 13 is passed in the capillary 12, a spark is ignited on the tip of the gold wire 13, and a ball is formed on the tip. At next step (b), the capillary 12 is lowered to press on an electrode 14 of the electronic part 3. At this time, an ultrasonic wave is applied to bond the electrode 14 and gold wire 13 (1st bonding). At step (c), consequently, the capillary 12 is lifted, and is lowered again while controlling the loop, and, at step (d), the capillary 12 presses on the gold ball of first bonding, and cuts off the gold wire 13 (2nd bonding).

A regulating section of electronic parts is described in detail below.

FIG. 8 is a plan view of electronic parts regulating section.

As shown in FIG. 8, the regulating section of the bump bonding device is composed of a stage 1 having a suction hole, a regulating pawl 2 movable in the XY direction, and a regulating spring 5 for applying a regulating force in the Y direction of the regulating pawl 2, in which the electronic part 3 moves on the suction hole of the stage 1 by means of the regulating pawl 2, and is regulated in position on the stage 1 by vacuum suction. However, the suction force is insufficient for a tiny electronic part, a regulating section as shown in FIG. 9 is used.

As shown in FIG. 9, the regulating section is composed a stage 1, a plate 4 fixed at an end of the stage 1, a regulating pawl 2 movable in the XY direction, and a regulating spring 5 for applying a regulating force in the Y direction of the regulating pawl 2.

In this regulating section, it is hard to set the regulating pawl parallel to the plate 4, and therefore when regulating the position of the electronic part 3, if a regulating force is applied to the electronic part 3 by the regulating pawl 2, a corner 3a of the electronic part may collide against the plate 4, and the electronic part may be broken.

FIG. 10 is a flowchart showing operation by the conventional electronic parts regulating device.

The electronic part is put on the stage 1 of the bump bonding device, the suction device is turned on, the electronic part is positioned, and, in this state, the electronic part 3 is bonded. In the case of a tiny electronic part, however, the suction hole is not suited to the dimension of the electronic part, or the suction hole located on the regulating track of the electronic part cannot be blocked according to the dimension of the electronic part, and suction errors often took place.

Generally, a tiny electronic part is fragile, and therefore when handling a tiny electronic part, it is required to decrease the impact force when regulating the position to prevent breakage of electronic part. It is hence an object of the invention to present an electronic part of high reliability, free from breakage when positioning the electronic part. Besides, if suction error occurs, the electronic part is likely to be cooled and defective bonding is caused, and, therefore, by preventing suction error, it is also an object of the invention to present an electronic part of high reliability with a lower rate of defective bonding.

SUMMARY OF THE INVENTION

The bump bonding device of the invention comprises a stage for mounting and heating an electronic part, and a position regulating device of electronic part including a rotatable regulating plate having a side for positioning the electronic part, a plate having a side for positioning the electronic part in collaboration with the regulating plate, and a regulating spring for applying a regulating force to the regulating plate in order to press the electronic part to the plate, and therefore the electronic part is regulated as being bonded between the regulating plate and the plate surface, and breakage is prevented, so that the reliability of electronic parts can be enhanced.

BRIEF DESCRIPTION OF THE DRAWINGS

FIG. 10 is a flowchart showing action by a conventional regulating device of electronic parts.

BEST MODE OF CARRYING OUT THE INVENTION

The invention as set forth in claim 1 comprises a stage for mounting and heating an electronic part, and a position regulating device including a rotatable regulating plate having a side for positioning the electronic part, a plate having a side for positioning the electronic part in collaboration with the regulating plate, and a regulating spring for applying a regulating force to the regulating plate in order to press the electronic part to the plate, and therefore the electronic part is regulated in position as being bonded between the surfaces of the regulating plate and the plate, and breakage of the electronic part is prevented, so that the reliability of electronic part can be enhanced.

In the invention as set forth in claim 2, the rotatable regulating plate is provided with a balance spring at right angle to the regulating spring in order to prevent excessive rotation in the rotating direction, and the same action as in claim 1 is obtained.

In the invention as set forth in claim 3, a regulating spring is provided at one side of the balance spring, and the regulating force is applied also to the balance spring, and the same action as in claim 1 is obtained.

The invention as set forth in claim 4 relates to a bump bonding method in the bump bonding device disposed on the moving track of electronic parts when regulating the electronic parts, and having suction holes for sucking electronic parts by vacuum, which comprises a step of putting electronic parts on a stage, a step of turning on suction of electronic parts by suction holes in the stage, a step of moving electronic parts along the suction holes arranged on the moving track of the electronic parts, and pressing the electronic parts to the plate by a regulating plate to position, and a step of turning off the suction of electronic parts, and therefore cooling of electronic parts due to suction error of electronic parts is prevented and defective bonding is avoided, so that the reliability of electronic parts can be enhanced.

Embodiments of the invention are described below while referring to FIG. 1 to FIG. 5.

EMBODIMENT 1

Figure 1:
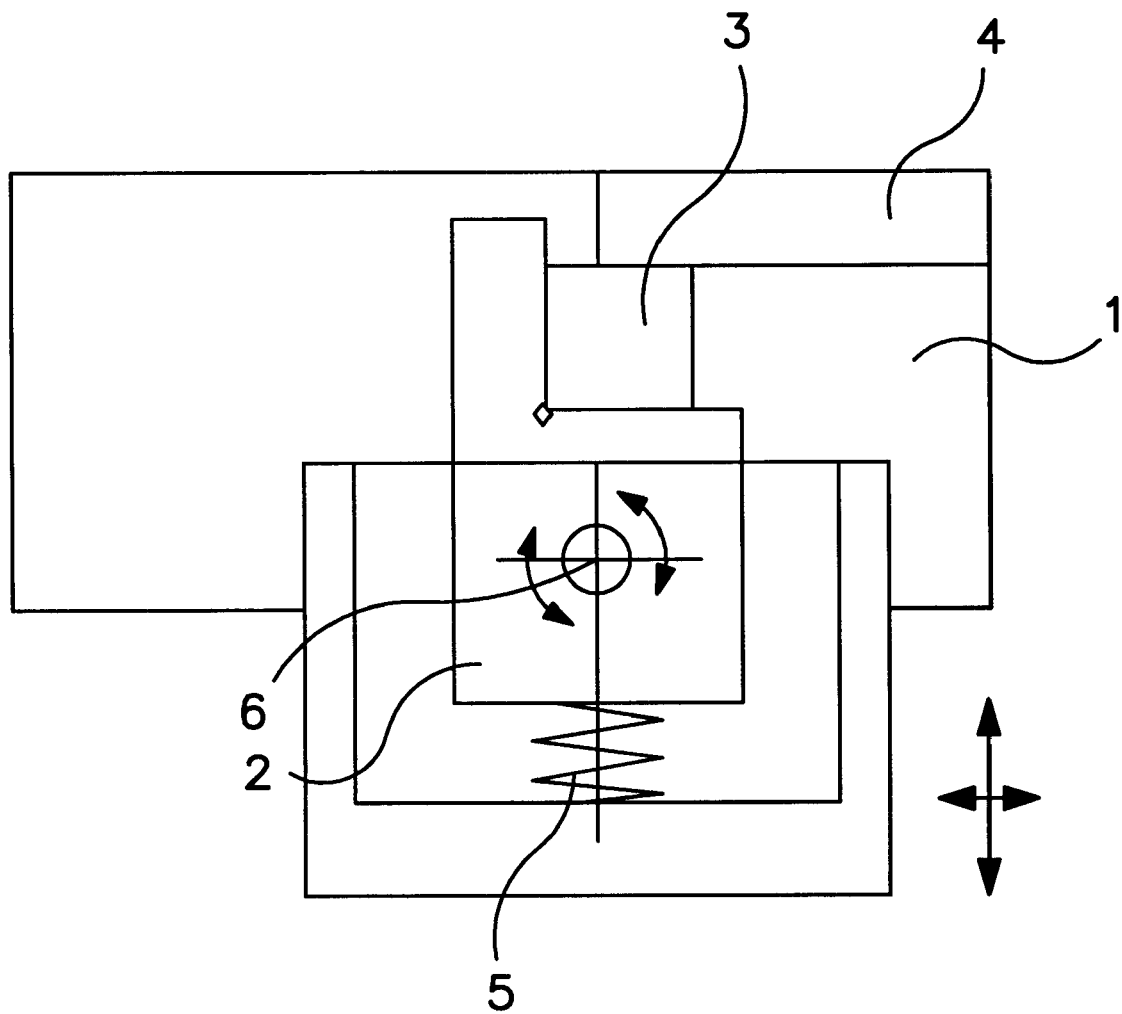
FIG. 1 is a plan view showing a regulated state of an electronic part in an embodiment of the invention.

FIG. 1 is a plan view showing a regulated state of an electronic part in an embodiment of the invention, in which an electronic plate 3 is supported by a plate 4 at one side, and by sides of a regulating plate 2 at other two sides. The regulating plate 2 is provided with a regulating force in the spring direction by means of a regulating spring 5, and is provided rotatably about a fulcrum 6. Therefore, when regulating the position of the electronic part, since the electronic part 3 is regulated in position by contacting with the surfaces of the regulating plate 2 and plate 4, concentrated load is not applied to the electronic part 3, breakage of electronic part 3 is prevented, so that the reliability of the electronic part 3 can be enhanced.

EMBODIMENT 2

Figure 2:
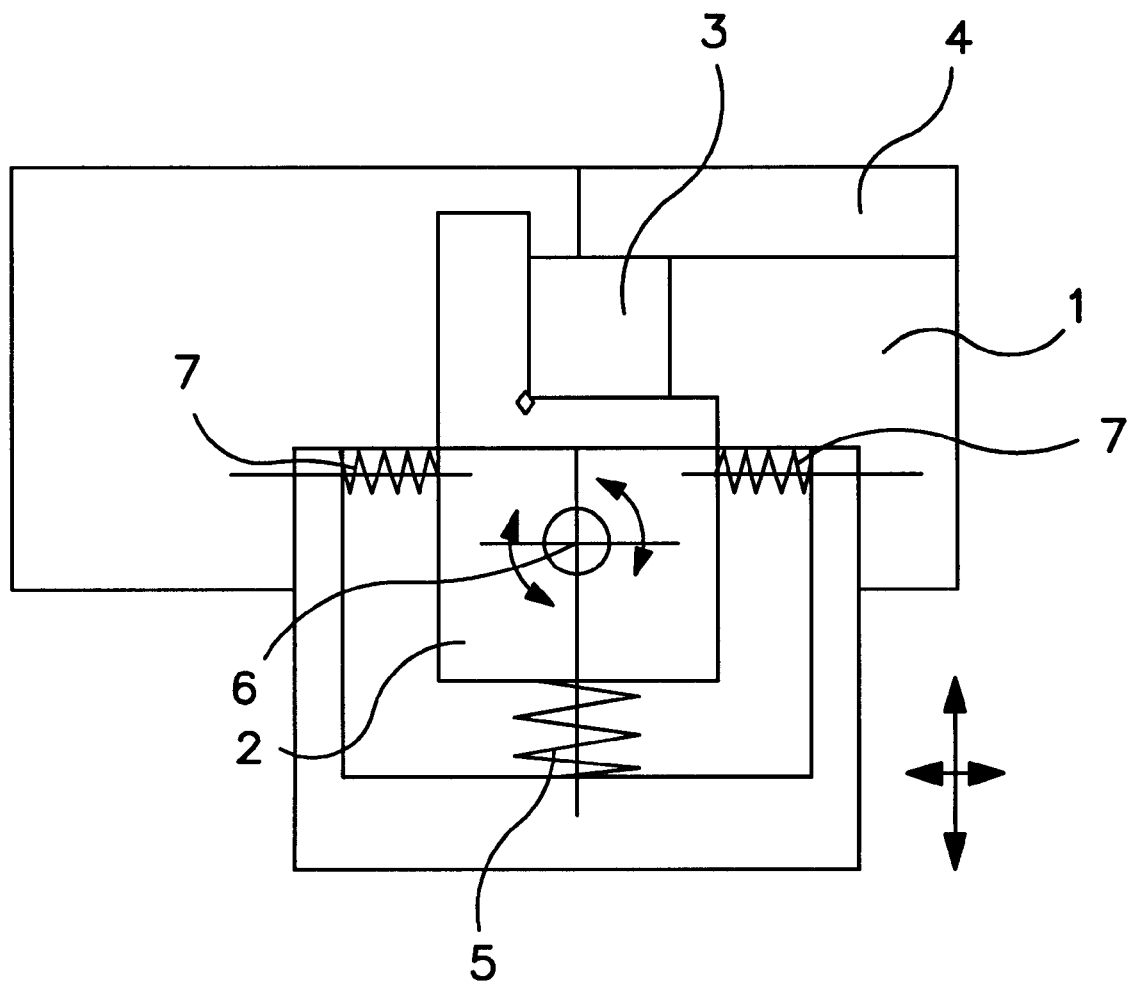
FIG. 2 is a plan view showing a regulated state of an electronic part in an embodiment of the invention.

FIG. 2 is a plan view showing a regulated state of an electronic part in other embodiment of the invention, the description of the same constitution as in FIG. 1 is omitted. In FIG. 2, what differs from FIG. 1 is that a balance spring 7 is provided at right angle to the regulating spring 5. In this constitution, when the regulating plate 2 rotates about the fulcrum 6, excessive rotation of the regulating plate 2 is prevented by spring force by the balance spring 7, so that the surface of the regulating plate 2 may be maintained at the same level as the surface of the electronic part 3. Accordingly, same as in embodiment 1, breakage of the electronic part 3 can be prevented.

As a specific example of this embodiment, the electronic part 3 was made of a silicon IC chip measuring 1.4×1.3 (mm) and 0.3 (mm) in thickness, and the regulating spring 5 was adjusted in the regulating push-in extent so that the maximum load be 50 g, and a load of 200 g was applied to the actual electronic part 3. The maximum load of the balance spring 7 was 300 g each.

EMBODIMENT 3

Figure 3:
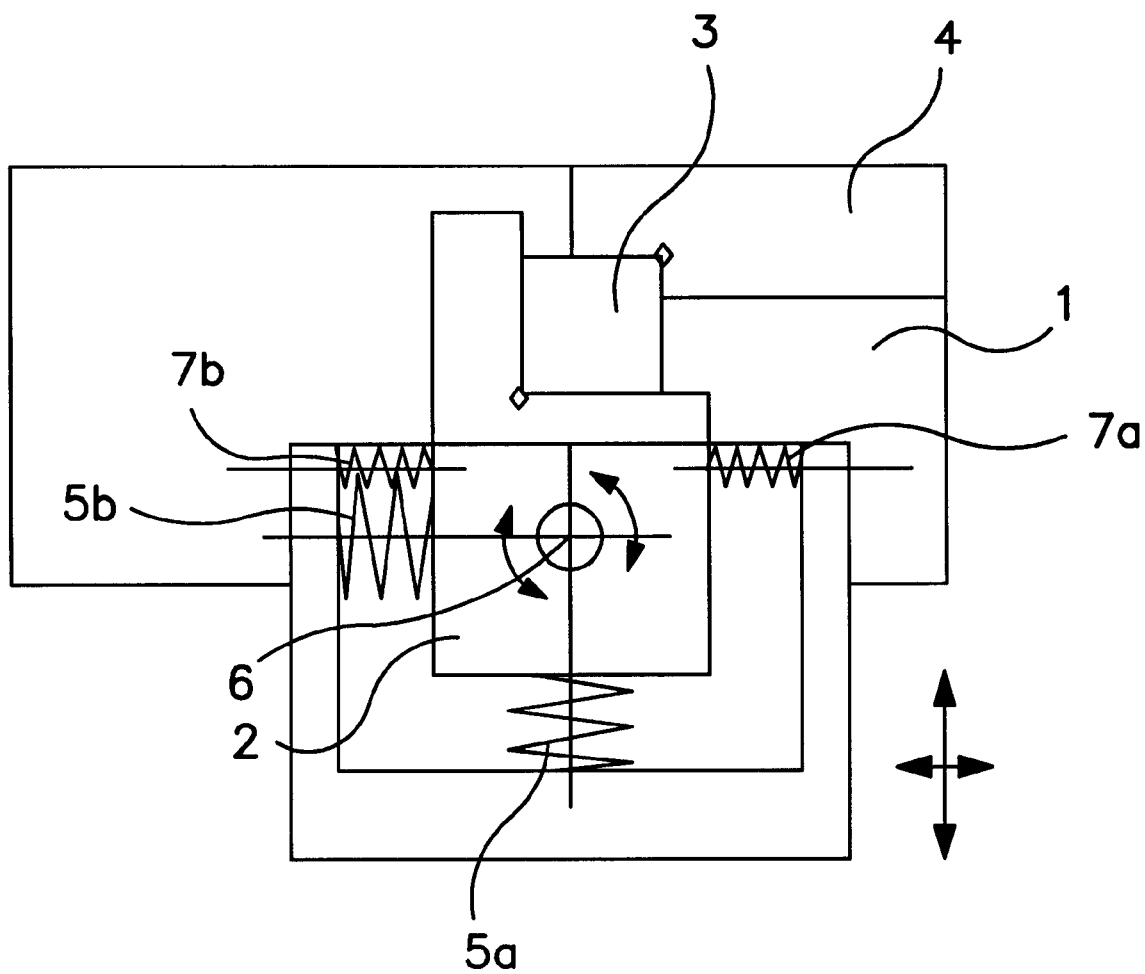
FIG. 3 is a plan view showing a regulated state of an electronic part in an embodiment of the invention.

FIG. 3 is a plan view showing a regulated state of an electronic part in a different embodiment of the invention, the description of the same constitution as in FIG. 2 is omitted. In FIG. 3, what differs from FIG. 2 is that a regulating spring 5b is provided in the same direction as the thrusting direction of the balance spring 7, and that notches are formed at four corners of the plate 4 so as to bonded with the electronic part 3 at two sides. In this constitution, regulating force is applied also in the thrusting direction of the balance spring 7, so that the electronic part 3 may be fixed more stably.

EMBODIMENT 4

Figure 4:
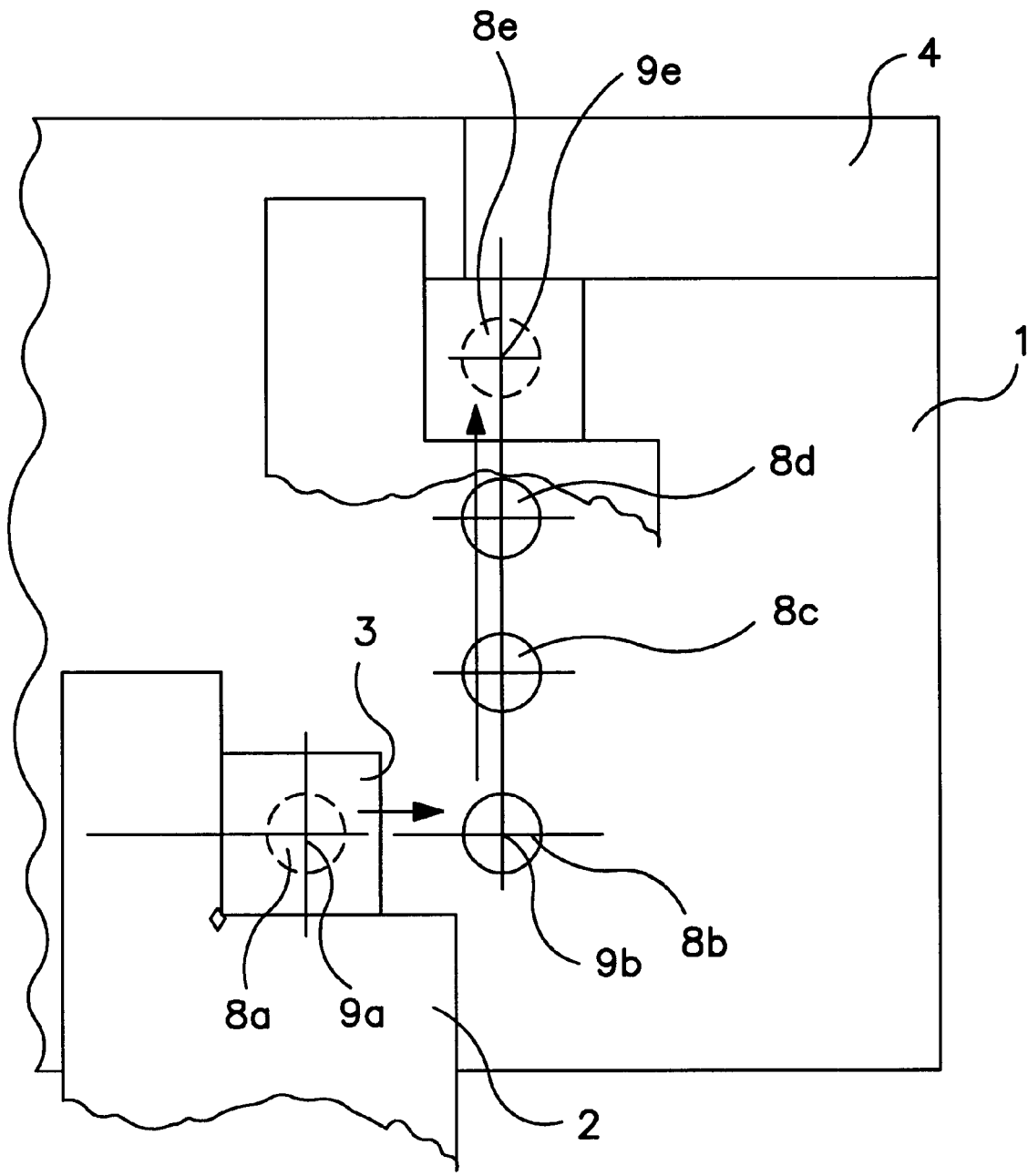
FIG. 4 is a plan view showing configuration of suction holes and moving track of electronic parts in an embodiment of the invention.
Figure 5:
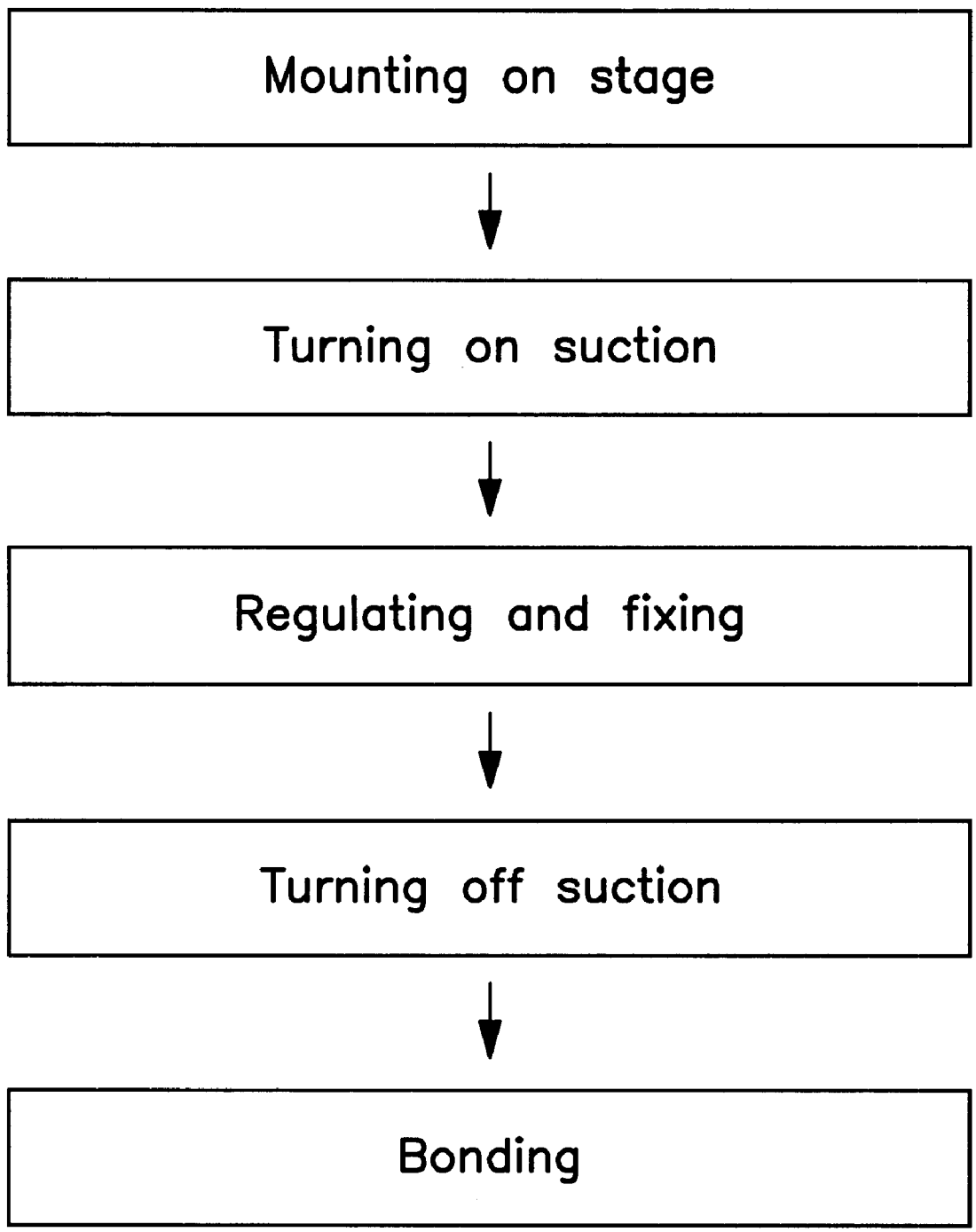
FIG. 5 is a flowchart showing regulating action of electronic part in an embodiment of the invention.
Figure 6:
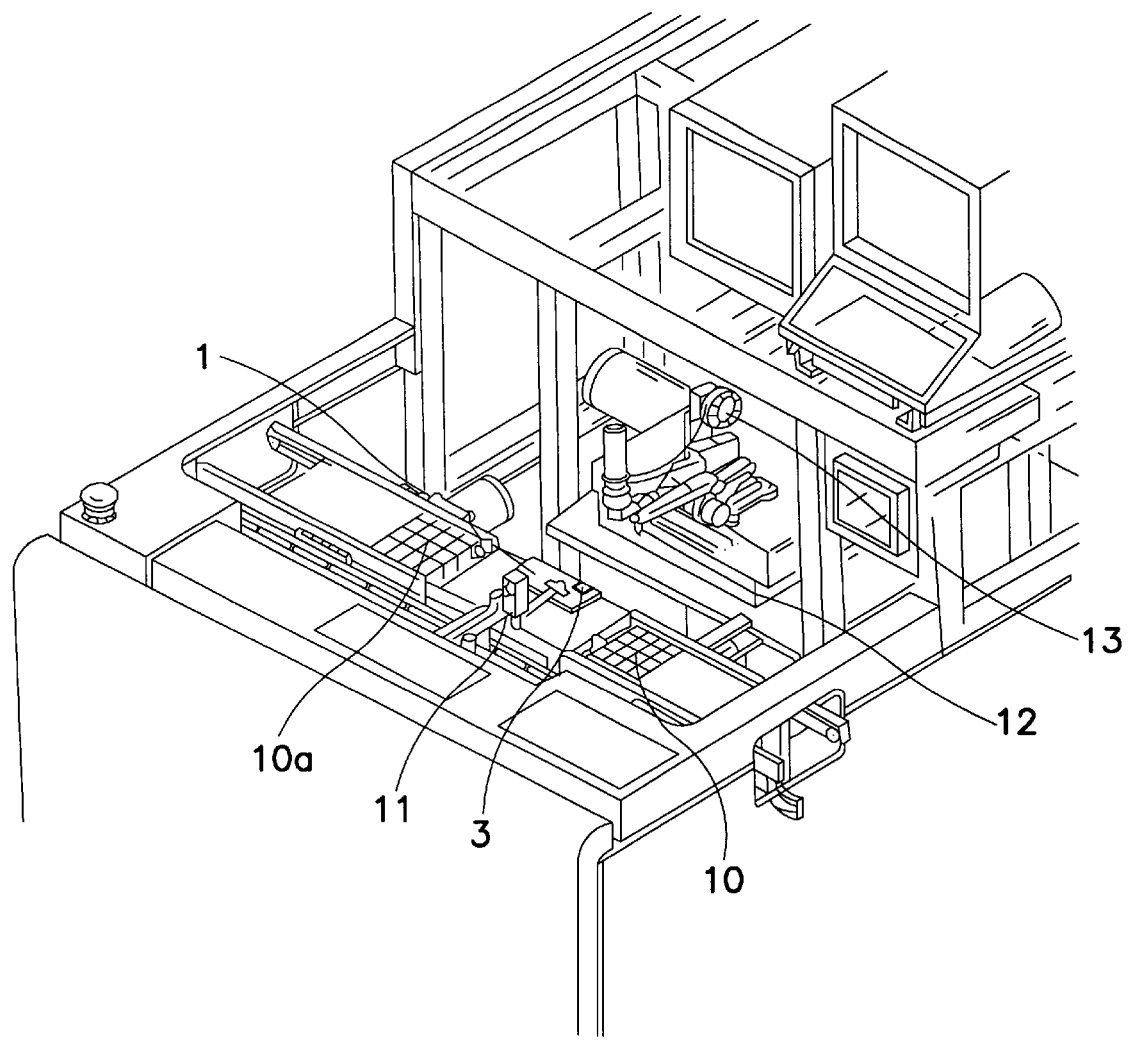
FIG. 6 is a perspective view of a conventional bump bonding device.
Figures 7A, 7B, 7C, 7D:
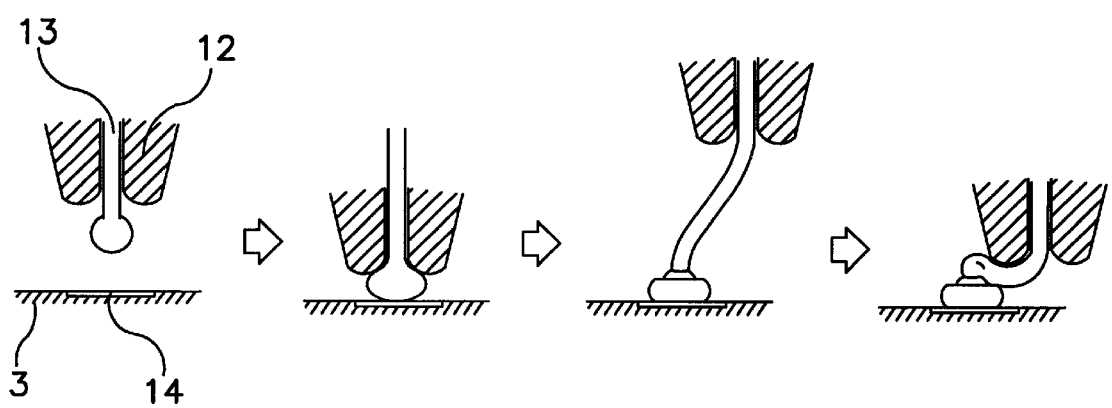
FIG. 7 is a bump bonding process diagram showing a conventional bump shape.
Figure 8:
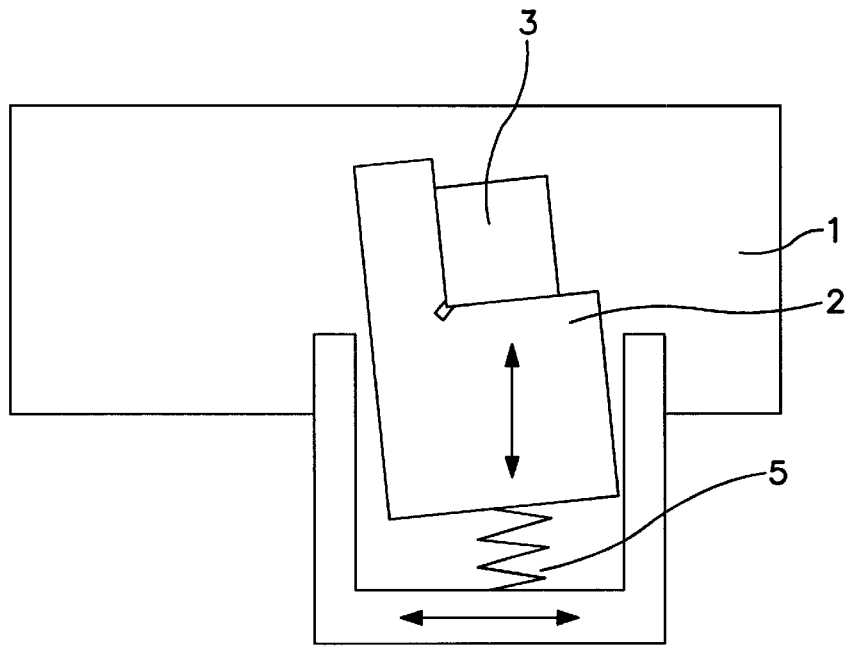
FIG. 8 is a plan view showing a regulated state of a conventional electronic part.
Figure 9:
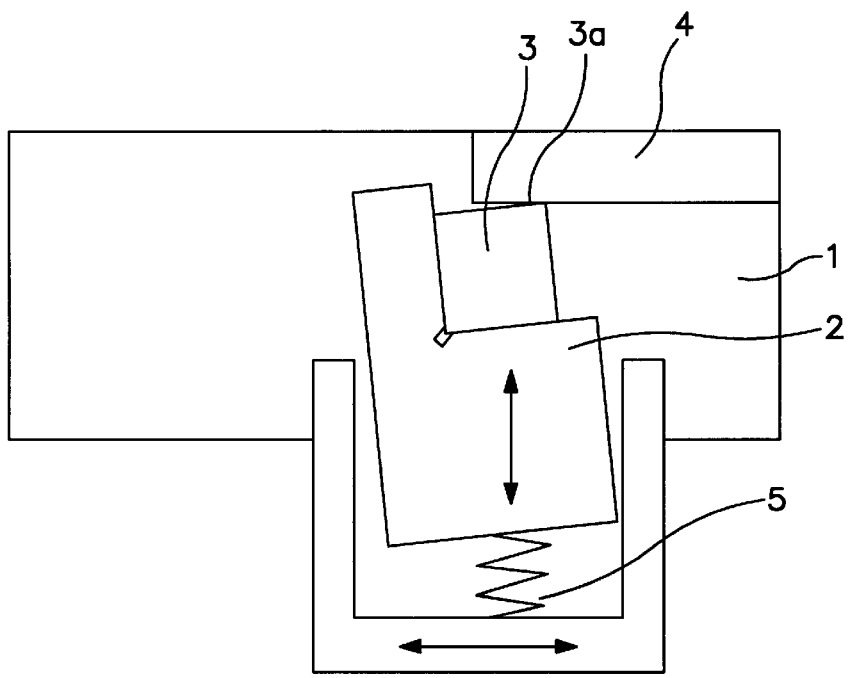
FIG. 9 is a plan view showing a regulated state of a conventional electronic part.

FIG. 4 is a plan view showing configuration of suction holes and moving track of electronic parts in other different embodiment of the invention, and FIG. 5 is a flowchart showing its action. In FIG. 4, reference numerals 8a to 8e are suction holes for sucking the electronic part 3 by vacuum.

First, when the electronic part 3 is put on position 9a of the stage 1, the electronic part 3 is sucked by the suction hole 8a. At this time, if the electronic part 3 is not sucked by the suction hole 8a, the electronic part 3 rotates or sticks to the nozzle side if attempted to mount. In FIG. 4, the regulating plate 2 is already in contact with the electronic part 3, but when the electronic part 3 is put on the stage 1, the electronic part 3 is no longer contacting with the regulating plate, and they contact with each other only when the electronic part 3 is sucked. Later, the electronic part 3 moves on the suction holes 8a to 8e. At this time, all suction holes are sucking, the electronic part 3 moves neatly along the suction holes and is fixed at position 8e (see embodiments 1 and 2). Then, the suction of the suction holes 8a to 8e is cut off. In this constitution, occurrence of suction error can be prevented, and therefore the electronic part 3 is not cooled, and defective bonding is prevented.

In this embodiment, five suction holes 8 are provided, but the number or configuration is not specifically defined, and various forms are possible. It is also applicable to the stage capable of bonding a plurality of electronic parts.

INDUSTRIAL APPLICABILITY

Thus, according to the invention, since concentrated load is not applied to a point of electronic part when regulating the electronic part, breakage of electronic part can be prevented. Moreover, since cooling of electronic part can be prevented, defective bonding can be avoided, so that the reliability of the electronic part can be enhanced.

What is claimed is:

1. A bump bonding method comprising the steps of:
   (a) putting an electronic part on a stage,
   (b) moving said electronic part on a moving track on said stage by sucking said electronic part using a plurality of suction holes arranged and formed in said stage,
   (c) pressing said electronic part to a plate fixed at a specified position of the stage by pushing a regulating plate to be in contact with said electronic part, said pushing of said regulating plate causing said regulating plate and said electronic part to rotate about a shaft on which said regulating plate is placed.

2. A bump bonding method of claim 1, wherein at said step (d), said electronic parts move on said moving track while being pushed to said regulating plate.

3. A bump bonding method of claim 2, wherein said regulating plate contacts with said electronic parts after said electronic parts are sucked by said suction holes.

4. The method of claim 1 further comprising the step of starting suction of said electronic part using a first suction hole formed in said stage.

5. The method of claim 1 further comprising the step of releasing suction of said electronic part after said step of pressing.

6. The method of claim 1 wherein said regulating plate is pushed to be in contact with said electronic part with a regulating spring.

7. The method of claim 1 further comprising the step of positioning said electronic part using a plurality of regulating springs, said springs pushing said regulating plate, said regulating plate being in contact with said electronic part.

* * * * *

UNITED STATES PATENT AND TRADEMARK OFFICE
CERTIFICATE OF CORRECTION

PATENT NO. : 6,481,616 B2
DATED : November 19, 2002
INVENTOR(S) : Imanishi et al.

It is certified that error appears in the above-identified patent and that said Letters Patent is hereby corrected as shown below:

<u>Column 4,</u>
Line 66, delete "(d)" and insert -- (c) --

Signed and Sealed this

Ninth Day of September, 2003

JAMES E. ROGAN
*Director of the United States Patent and Trademark Office*